US007719312B2

(12) United States Patent
Edwards et al.

(10) Patent No.: US 7,719,312 B2
(45) Date of Patent: *May 18, 2010

(54) APPARATUS FOR CONFIGURING I/O SIGNAL LEVELS OF INTERFACING LOGIC CIRCUITS

(75) Inventors: David Glen Edwards, Dallas, TX (US); Brian Matthew Johnson, Allen, TX (US); Mark A. Shaw, Sachse, TX (US); Stuart C. Haden, Lucas, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/458,204

(22) Filed: Jul. 2, 2009

(65) Prior Publication Data

US 2009/0267648 A1    Oct. 29, 2009

Related U.S. Application Data

(63) Continuation of application No. 11/583,322, filed on Oct. 19, 2006, now Pat. No. 7,589,560.

(51) Int. Cl.
*H03K 19/0175* (2006.01)
*H03K 19/094* (2006.01)
*H03K 19/082* (2006.01)

(52) U.S. Cl. .............................. 326/80; 326/62; 326/63; 326/81; 326/82; 326/83; 326/86; 326/90

(58) Field of Classification Search ..................... 326/81
See application file for complete search history.

(56) References Cited

U.S. PATENT DOCUMENTS

| 5,767,844 | A  | * | 6/1998  | Stoye          | 345/212 |
|-----------|----|---|---------|----------------|---------|
| 6,249,825 | B1 | * | 6/2001  | Sartore et al. | 710/8   |
| 6,460,143 | B1 | * | 10/2002 | Howard et al.  | 713/323 |
| 6,621,322 | B2 | * | 9/2003  | Suzuki         | 327/333 |
| 6,996,727 | B1 | * | 2/2006  | Snyder et al.  | 713/300 |
| 7,193,442 | B2 | * | 3/2007  | Zhu            | 326/82  |
| 7,353,408 | B2 | * | 4/2008  | Yeh            | 713/300 |
| 2003/0074588 | A1 | * | 4/2003 | Yin            | 713/300 |
| 2003/0135673 | A1 | * | 7/2003 | Chiu et al.    | 710/72  |
| 2004/0038565 | A1 | * | 2/2004 | Yen            | 439/79  |
| 2004/0268163 | A1 | * | 12/2004| Yeh            | 713/300 |
| 2005/0024088 | A1 | * | 2/2005 | Lee            | 326/81  |
| 2005/0039060 | A1 | * | 2/2005 | Okayasu        | 713/300 |
| 2005/0156037 | A1 | * | 7/2005 | Wurzburg       | 235/435 |
| 2005/0195012 | A1 | * | 9/2005 | Sueoka et al.  | 327/333 |

* cited by examiner

*Primary Examiner*—Rexford Barnie
*Assistant Examiner*—Matthew C Tabler

(57) ABSTRACT

Apparatus for configuring input/output signal levels of interfacing logic circuits operating at different voltage levels comprises: a logic circuit for operating at a first voltage level; a bank of input/output gates coupled to the logic circuit for interfacing input/output signals at a second voltage level, different from the first voltage level, to the logic circuit, the bank of gates including a port for setting the operational voltage level thereof; and a control circuit coupled to the port and governed by a control signal to configure the operational voltage level of the bank of gates to render the logic circuit and the interfacing input/output signals voltage level compatible.

17 Claims, 4 Drawing Sheets

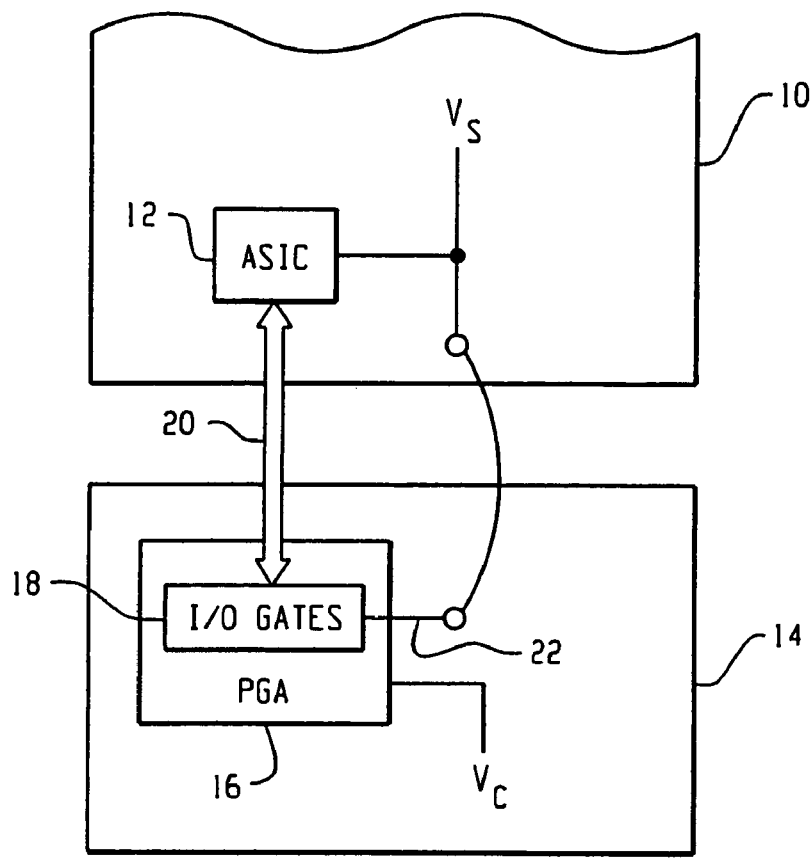
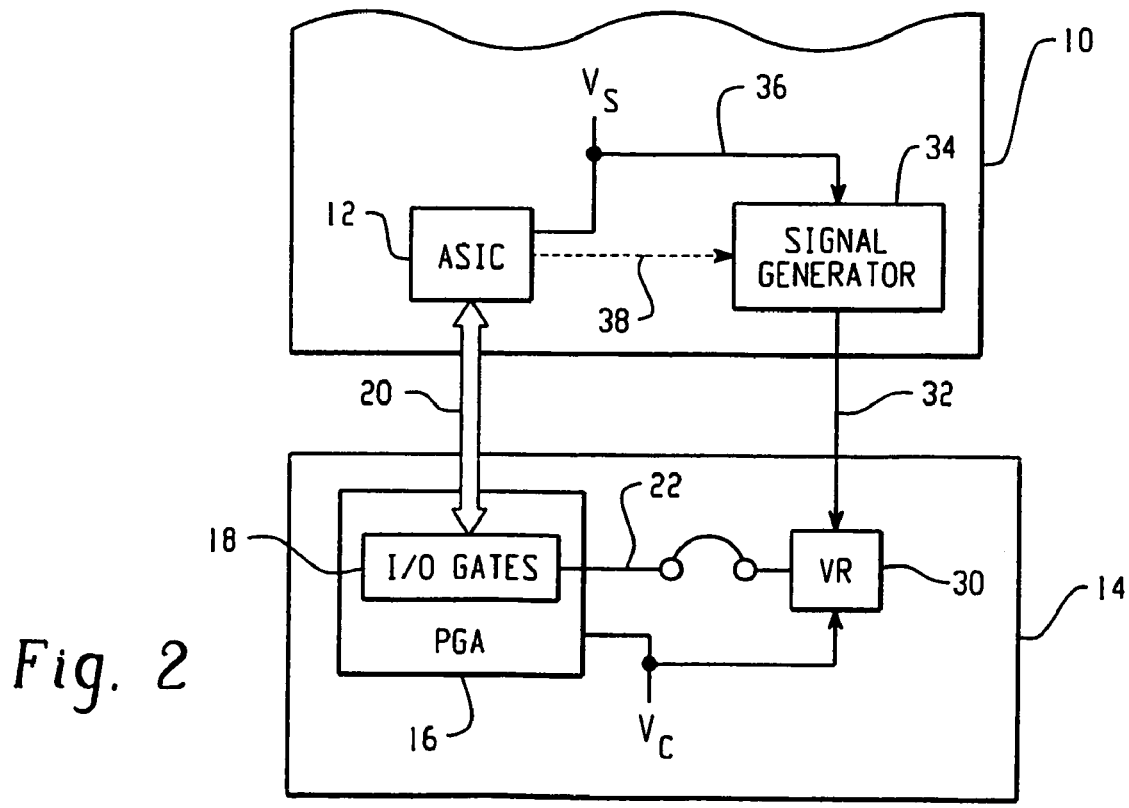

APPARATUS FOR CONFIGURING I/O SIGNAL LEVELS OF INTERFACING LOGIC CIRCUITS

CROSS-REFERENCE TO RELATED APPLICATION

This application is a continuation of U.S. patent application Ser. No. 11/583,322, filed Oct. 19, 2006 now U.S. Pat. No. 7,589,560.

BACKGROUND

Interfacing logic circuits with different I/O voltage levels is a problem that arises frequently, especially in the design of printed circuit boards (PCBs). Contemporary PCBs are designed with logic circuits in the form of fixed I/O integrated circuits, like application specific integrated circuits or chips (ASICs), for example. Because of rapidly changing integrated circuit technology, creating a design that is forwards compatible or backwards compatible with such fixed I/O devices presents a challenge. Often times, to achieve forwards and/or backwards compatibility, a new PCB design and/or added voltage translators are required.

These solutions involve either redesigning a PCB or using a PCB that can be loaded with different circuit components to interface with the different logic circuits of different PCBs. Generally, each board redesign includes increased design time, cost, added product inventory and qualification. Using the same PCB loaded with different circuit components may reduce design time, but still requires added inventory and qualification, which will increase cost.

SUMMARY

In accordance with one aspect of the present invention, apparatus for configuring input/output signal levels of interfacing logic circuits operating at different voltage levels comprises: a logic circuit for operating at a first voltage level; a bank of input/output gates coupled to the logic circuit for interfacing input/output signals at a second voltage level, different from the first voltage level, to the logic circuit, the bank of gates including a port for setting the operational voltage level thereof; and a control circuit coupled to the port and governed by a control signal to configure the operational voltage level of the bank of gates to render the logic circuit and the interfacing input/output signals voltage level compatible.

BRIEF DESCRIPTION OF THE DRAWINGS

FIG. 1 is a block diagram schematic of an exemplary embodiment of one aspect of the present invention.

FIG. 2 is a block diagram schematic of an exemplary embodiment of another aspect of the present invention.

DETAILED DESCRIPTION

Figure 3:
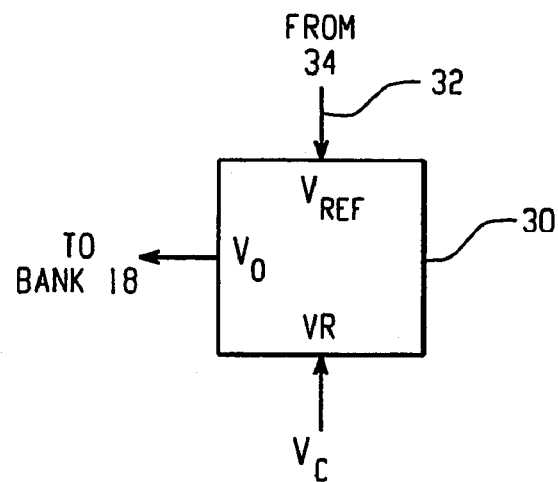
FIG. 3 is a circuit schematic of an exemplary control circuit suitable for use in the embodiment of FIG. 2.

An exemplary embodiment of one aspect of the present invention is depicted in the block diagram schematic of FIG. 1. This exemplary embodiment provides a cross-board solution that allows a daughter board to interface to a variety of native signaling standards across a set of different mother boards. Referring to FIG. 1, fixed logic circuits of one printed circuit board (PCB) 10 which may be a mother board, for example, operate at a first voltage level which may be on the order of 2.5 to 2.8 volts, for example. In the present embodiment, the fixed logic circuits of board 10 are designed into an application specific integrated circuit (ASIC) 12 which is powered by a local power supply $V_s$. In this embodiment, the voltage level of the signals of the ASIC 12 are set by the voltage V.

An interfacing PCB 14, which may be considered a daughter board, is interfaced with the mother board 10. The PCB 14 contains logic circuits that operate at a different voltage level. In this embodiment, some of the logic circuits of board 14 are programmed into a programmable gate array (PGA) 16 which may be of the field programmable type manufactured by Xilinx Corp. under the model no. XC3S100, for example. The PGA 16 may be powered by several power supply voltages. The core logic of PGA 16 is powered by a local power supply $V_c$, which may be at 1.2 volts, for example. I/O signals of the PGA 16 are conducted through a bank of I/O gates 18 to a signal bus 20 which interconnects the I/O signals of the PGA 16 with I/O signals of the ASIC 12. The bank of I/O gates 18 is powered by a voltage, supplied to a bank power supply port 22, which may be set different from the core logic voltage level of the PGA 16. Accordingly, the operational voltage level of the I/O gates 18 will be set by the voltage at the supply port 22.

In this embodiment, the I/O signals of the PGA 16 may be rendered compatible with the I/O signals of the ASIC 12 by setting an appropriate voltage at the bank power supply port 22. Since the operational voltage levels of the I/O signals of the ASIC 12 are set by the power supply $V_s$, one way of providing voltage level compatibility of the I/O signals over the bus 20 is by connecting the power supply $V_s$ of board 10 to the supply port 22 as shown in the schematic of FIG. 1. In this configuration, the bank of I/O gates 18 of the PGA 16 will operate at a voltage level compatible with the I/O signal levels of the ASIC 12 notwithstanding the different operational signal levels of the logic circuits 12 and 16 of the interfacing PCBs 10 and 14, respectively. In this manner, the I/O signals of logic circuits of one PCB may be interfaced with I/O signals of logic circuits of another PCB independent of the difference in operational voltage levels thereof.

There may be occasions in which connecting the power supply of one board to another board is considered undesirable for whatever reason. The block diagram schematic of FIG. 2 depicts a suitable alternative embodiment to that of FIG. 1 for configuring the bank of I/O gates 18 to render the I/O signals of the interfacing board 14 compatible with the I/O signals of the board 10. In the embodiment of FIG. 2, a voltage regulator (VR) 30 may be disposed on board 14 to power the bank of I/O gates 18 via port 22. An exemplary voltage regulator 30 for the present embodiment may be of the type manufactured by Linear Technologies under the model no. LT1963, for example. The VR 30 may be powered by the local supply $V_c$ and its output voltage level governed by an external signal over line 32 to set the operational voltage level of the bank of gates 18.

In the present embodiment, the governing signal 32 may be generated by a signal generator circuit 34 disposed on the mother board 10. If the operational voltage level of the logic circuits 12 of board 10 are set by the supply $V_s$, then the signal generator 34 may be governed thereby to generate the signal over line 32 to control the VR 30 as illustrated by the line 36. In the alternative, the signal generator 34 may be governed by a signal generated by the logic circuits 12 as shown by the dashed line 38. The intent is to set the operational voltage level of the bank of gates 18 by the VR 30 to render the I/O signals of the interfacing board 14 compatible with the I/O signals of the motherboard 10.

For example, if the daughter board 14 is installed on a different mother board which is powered by a different voltage level than $V_s$, then the operational voltage level of the I/O signals of the ASIC of the different mother board will also change. In the embodiment of FIG. 2, the signal generator 34 may detect this change by either monitoring the voltage level of its power supply via line 36 or monitoring the operational voltage of the logic of the new ASIC via line 38. In either case, the signal generator 34 may adjust the governing signal 32 accordingly to control the VR 30 to render the appropriate supply voltage to the bank of I/O gates 18 via port 22. In this manner, the signal generator 34 may render the I/O signals of the PGA 16 on the daughter board 14 compatible with the I/O signals of any mother board and ASIC interfaced thereto.

Figure 4:
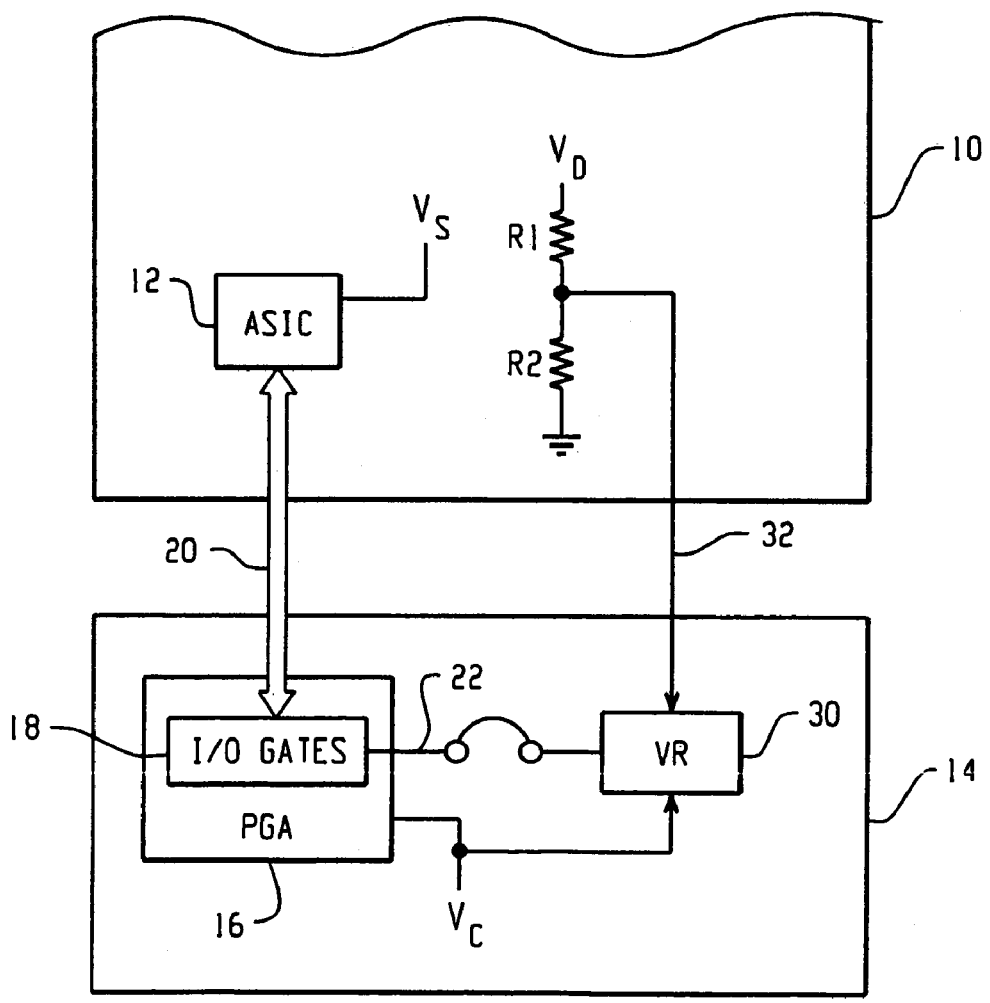
FIG. 4 is a block diagram schematic of an alternate embodiment of the present invention.

In one case as depicted in FIG. 3, the governing signal 32 may be an analog signal which is input to a voltage reference port of the VR 30 to adjust its output voltage $V_o$ commensurate therewith. The output $V_o$ powers the bank of gates 18 via port 22. In this example, the signal generator 34 is connected via line 32 to the VR 30 to adjust the output voltage thereof to render the I/O signals of the logic circuits 16 compatible with the logic circuits 12. In one embodiment as depicted in FIG. 4, a governing analog signal 32 of the VR 30 may be set by a resistance network comprising resistors R1 and R2 powered by a voltage $V_D$ which may be the same as $V_s$ or different therefrom. In this embodiment, the voltage of signal 32 may be set commensurate to the supply voltage powering the ASIC 12 or by adjusting the resistance of the resistance network R1/R2 accordingly.

Figure 5:
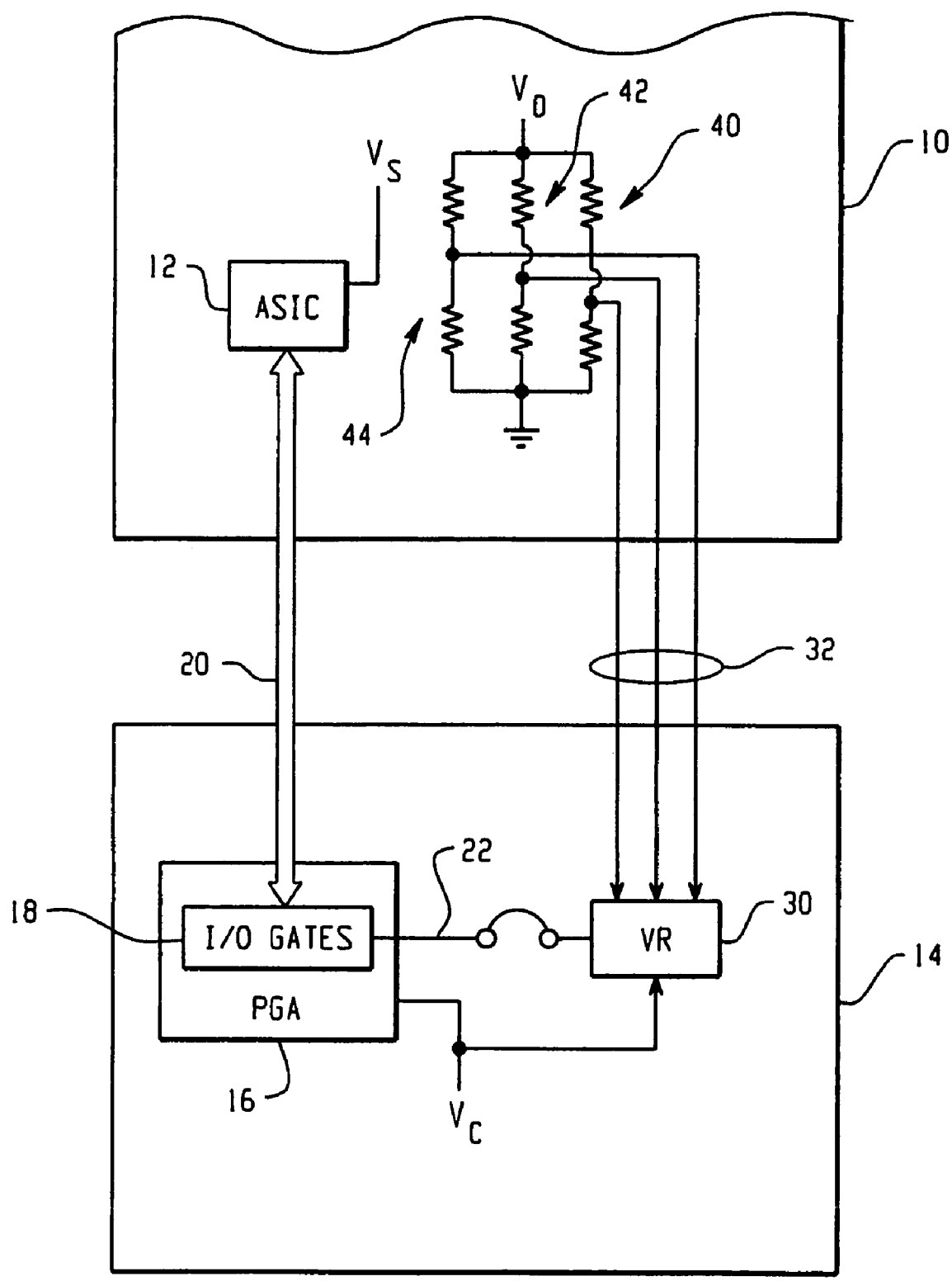
FIG. 5 is a block diagram schematic of another alternate embodiment of the present invention.

In another embodiment as depicted in FIG. 5, the governing signal 32 of the VR 30 may be digitally set by a plurality of resistance networks 40, 42 and 44 configured in parallel and powered by the voltage $V_D$ which may be the same as $V_s$ or different therefrom. Each resistance network may include a pull-up resistor and a pull-down resistor. The voltage at each connecting node of the pull-up and pull-down resistors of the resistance networks 40, 42 and 44 may be considered a digital one or zero to provide the digital code 32 to the VR 30. In this embodiment, the digital code of signal 32 may be set commensurate to the supply voltage powering the ASIC 12 by adjusting the resistance of the resistance networks 40, 42 and 44. For example, when the ASIC 12 is replaced with a new ASIC with a different operational voltage, the resistance of the networks 40, 42 and 44 may be set to provide the appropriate digital code for signal 32 to reflect the new operational voltage.

The resistance of each network 40, 42 and 44 may be adjusted or set by installing or removing a pull-up or pull-down resistor thereof. For instance, for a '1,1,1' digital code may be implemented by installing a predetermined ohm pull-up resistor and removing the pull-down resistor in each of the networks 40, 42 and 44. Another implementation to adjust the resistance of the networks 40, 42 and 44 for the same code may be to install a 100 ohm resistor for each pull-up resistance and install a 1K ohm resistor for each pull-down resistance.

Figure 6:
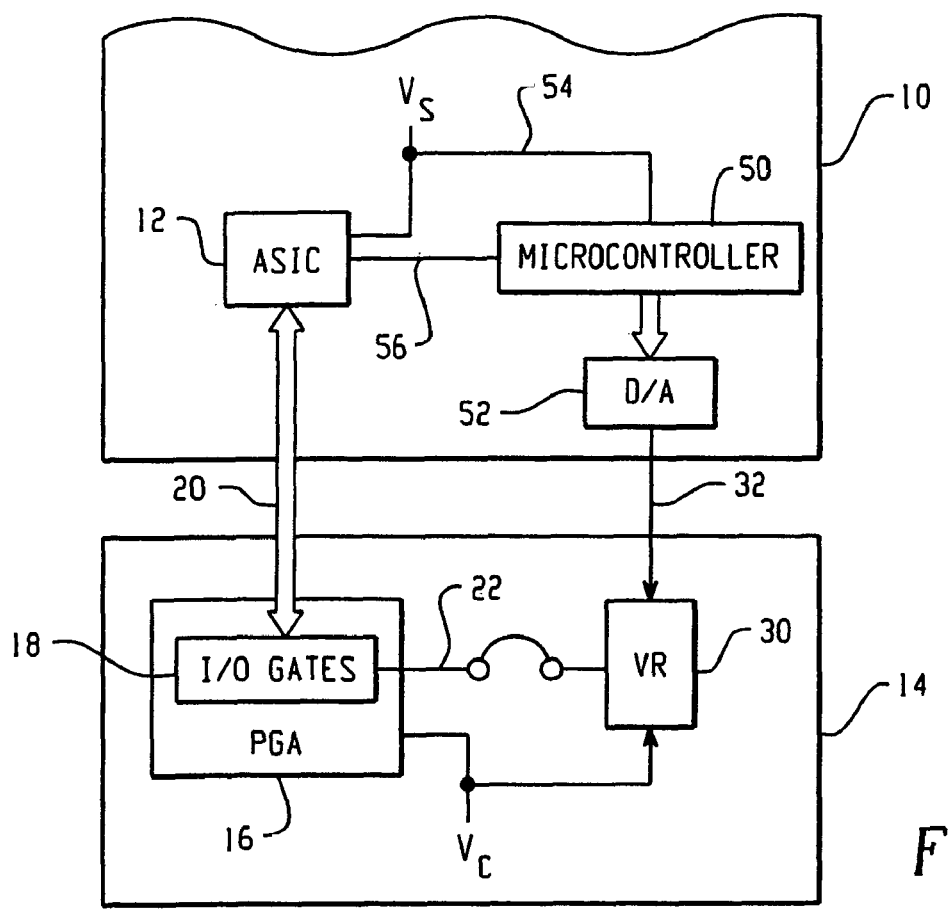
FIG. 6 is a block diagram schematic of yet another alternate embodiment of the present invention.

In yet another embodiment as depicted in FIG. 6, a microcontroller 50 may be included on the PCB 10 to control a digital-to-analog (D/A) converter 52 to render the appropriate voltage of the governing signal 32. In this embodiment, the microcontroller 50 may be operative to monitor the voltage of the power supply $V_s$ of the ASIC 12 via line 54 or to monitor the operational voltage of the logic of the ASIC 12 via line 56 and control the output voltage of the D/A converter 52 accordingly.

Figure 7:
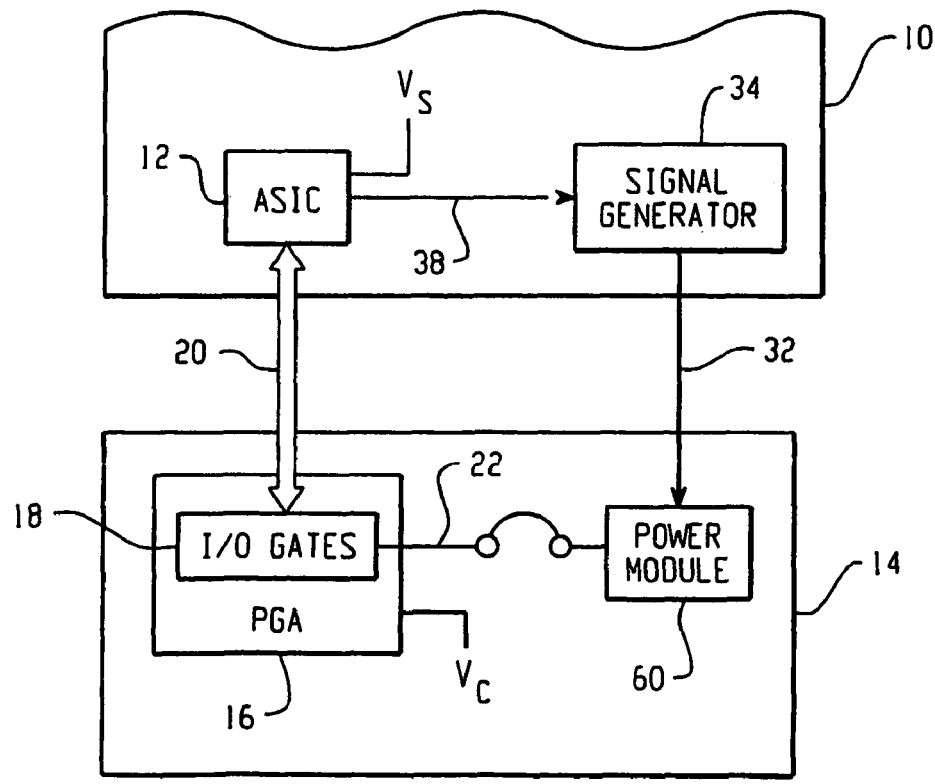
FIG. 7 is a block diagram schematic of yet another alternate embodiment of the present invention.

In yet another alternate embodiment of the present invention as illustrated in the block diagram schematic of FIG. 7, the voltage regulator 30 may be replaced with a programmable power module 60 which may be of the type manufactured by Linear Technology bearing model no. LTC7510, for example. In this example, the power module 60 may be governed by the governing signal 32 to produce the desired voltage output to power the bank of gates 18 via port 22. The power module 60 may either accept an analog or digital signal 32 to adjust or trim its output voltage to the desired level to render the I/O signal levels between the logic circuits 12 and 16 compatible with one another.

In summary, the present invention allows I/O signals of logic circuits on an interfacing PCB to interface compatibly with I/O signals of fixed logic circuits having different operational signal levels. Accordingly, the invention increases design flexibility on future systems by allowing for I/O signal level adjustments to achieve interface compatibility as chip technology changes the operational voltage level of fixed logic circuits.

While the present invention has been described herein above in connection with one or more embodiments, it is understood that such presentations were made merely by way of example. For example, some of the embodiments depict control circuits on the PCB 10 and the voltage regulation circuits on PCB 14, but this need not be the case. These circuits may be embodied on either PCB 10 or PCB 14 or in a different location altogether. Therefore, the present invention should not be limited in any way to any such described embodiments, but rather construed in breadth and broad scope in accordance with the recitation of the claims appended hereto.

What is claimed is:

1. Apparatus for configuring input/output signal levels of interfacing logic circuits operating at different voltage levels, said apparatus comprising:

a logic circuit for operating on a first printed circuit board (PCB) at a first voltage level;

a bank of input/output gates located on a second PCB and coupled to said logic circuit for interfacing input/output signals at a second voltage level, different from said first voltage level, to said logic circuit located on said first PCB, said bank of input/output gates including a port for setting the operational voltage level thereof;

a control circuit coupled to said port and governed by a control signal to configure the operational voltage level of said bank of input/output gates to render said first voltage level of said logic circuit located on said first PCB the same as said operational voltage level of said interfacing input/output signals conducted by said bank of input/output gates located on said second PCB;

a resistance network; and wherein the governing signal is settable by adjusting the resistance of said resistance network.

2. The apparatus of claim 1 wherein the second voltage level of the interfacing input/output signals is governed by a voltage level from a power supply external to the logic circuit; and wherein the control circuit comprises means for connecting said external power supply to the port of the bank of input/output gates to operate the bank of input/output gates.

3. The apparatus of claim 1 wherein the control circuit comprises a voltage regulator for generating an output signal which is coupled to the port of the bank of input/output gates for controlling the operational voltage level thereof, said voltage regulator being governed by a signal, representative of the second voltage level, to generate said output signal to render said first voltage level of said logic circuit located on said first PCB the same as said operational voltage level of said interfacing input/output signals conducted by said bank of input/output gates located on said second PCB.

4. The apparatus of claim 3 including a signal generator circuit for monitoring the second voltage level and for generating the governing signal to the voltage regulator commensurate with the monitored second voltage level.

5. The apparatus of claim 3 including a resistance network powered by a voltage level commensurate with the second voltage level; and wherein the governing signal is settable by said resistance network.

6. The apparatus of claim 3 including a resistance network; and wherein the governing signal comprises digital bit signals settable by adjusting the resistance of said network.

7. The apparatus of claim 3 including a digital controller operative to monitor the second voltage level; and a digital-to-analog converter coupled to said digital controller and controlled thereby to generate the governing signal commensurate with the monitored second voltage level.

8. The apparatus of claim 1 wherein the control circuit comprises a programmable power module for generating an output signal which is coupled to the port of the bank of input/output gates, said power module being governed by a signal representative of the second voltage level to generate said output signal to render said first voltage level of said logic circuit located on said first PCB the same as said operational voltage level of said interfacing input/output signals conducted by said bank of input/output gates located on said second PCB.

9. The apparatus of claim 1 wherein the logic circuit comprises a programmable gate array; and wherein the bank of input/output gates is integral to the programmable gate array.

10. A system for configuring input/output signal levels of interfacing logic circuits operating at different voltage levels, said system comprising:
   a first logic circuit for operating on a first printed circuit board (PCB) at a first voltage level;
   a second logic circuit for operating on a second PCB at a second voltage level different from said first voltage level;
   a bank of input/output gates located on said second PCB and coupled to said first logic circuit located on said first PCB for interfacing input/output signals between said first and second logic circuits, said bank of input/output gates including a port for setting the operational voltage level thereof; and
   a control circuit coupled to said port and governed by a control signal to configure the operational voltage level of said bank of input/output gates to render said first voltage level of said first logic circuit the same as said operational voltage level of said interfacing input/output signals conducted by said bank of input/output gates located on said second PCB;
   a resistance network;
   and wherein the governing signal is settable by adjusting the resistance of said resistance network.

11. The system of claim 10 wherein the second logic circuit is powered by a power supply at the second voltage level; and wherein the control circuit comprises means for connecting said power supply to the port of the bank of input/output gates for the operation thereof.

12. The system of claim 10 wherein the control circuit comprises a voltage regulator for generating an output signal which is coupled to the port of the bank of input/output gates, said voltage regulator being governed by a signal representative of the second voltage level to generate said output signal to render said first voltage level of said logic circuit located on said first PCB the same as said operational voltage level of said interfacing input/output signals conducted by said bank of input/output gates located on said second PCB.

13. The system of claim 12 including a signal generator for monitoring the second voltage level and for generating the governing signal to the voltage regulator commensurate with the monitored second voltage level.

14. The system of claim 12 including a resistance network powered by a voltage level commensurate with the second voltage level; and wherein the governing signal is settable by said resistance network.

15. The system of claim 12 including a resistance network; and wherein the governing signal comprises digital bit signals settable by adjusting the resistance of said network.

16. The system of claim 10 wherein the control circuit comprises a programmable power module for generating an output signal which is coupled to the port of the bank of input/output gates, said power module being governed by a signal representative of the second voltage level to generate said output signal to render said first voltage level of said logic circuit located on said first PCB the same as said operational voltage level of said interfacing input/output signals conducted by said bank of input/output gates located on said second PCB.

17. The system of claim 10 wherein the first logic circuit comprises a programmable gate array; and wherein the bank of input/output gates is integral to the programmable gate array.

* * * * *